Figure 1:
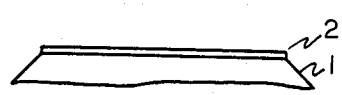

United States Patent [19]
Ferraris et al.

[11] Patent Number: 4,812,388
[45] Date of Patent: Mar. 14, 1989

[54] PROCESS TO OBTAIN THIN FILM LINES

[75] Inventors: Giampiero Ferraris, Monza; Antonio Tersalvi, Milan, both of Italy

[73] Assignee: GTE Telecomunicazioni, S.p.A., Cassina de Pecchi, Italy

[21] Appl. No.: 102,302

[22] Filed: Sep. 25, 1987

Related U.S. Application Data

[63] Continuation of Ser. No. 846,772, Mar. 31, 1986, abandoned.

[30] Foreign Application Priority Data

May 3, 1985 [IT] Italy ................................ 20567 A/85

[51] Int. Cl.[4] .............................................. G03C 5/16
[52] U.S. Cl. ..................................... 430/314; 430/316; 430/317; 430/318; 156/643; 156/646; 156/652
[58] Field of Search ............... 430/314, 313, 315, 317, 430/318, 319, 316; 156/661.1, 668, 646, 652, 643

[56] References Cited

U.S. PATENT DOCUMENTS

| | | | |
|---|---|---|---|
| 4,057,659 | 11/1977 | Pammer et al. | 427/89 |
| 4,451,971 | 6/1984 | Milgram | 29/578 |
| 4,502,916 | 5/1985 | Umezaki et al. | 156/643 |
| 4,523,976 | 6/1985 | Bukhman | 156/643 |
| 4,606,998 | 8/1986 | Clodgo et al. | 430/312 |

OTHER PUBLICATIONS

Cox et al., Minimal Metal Mask for RIE Polyimide, IBM Tech. Discl. Bull., vol. 23(2), Jul. 1980, p. 830.

*Primary Examiner*—José G. Dees
*Attorney, Agent, or Firm*—David N. Caracappa

[57] ABSTRACT

It is described a process to obtain thin film lines by photolithography of thick resist and subsequent selective galvanic growth of gold which enables to obtain very thin lines (2-10 micron) with high definition, that is with nearly vertical walls and with a tolerance in the width of about 1 micron. Such results have been achieved by using polyimide as thick resist, by particular cure cycles of the same polyimide and by a particular dry etching of the polyimide layer to obtain seats in which afterwards the lines become grown.

9 Claims, 1 Drawing Sheet

PROCESS TO OBTAIN THIN FILM LINES

CROSS-REFERENCE TO RELATED APPLICATION

This is a continuation of Ser. No. 846,772 filed Mar. 31, 1986 now abandoned.

DESCRIPTION

The present invention refers to a process to obtain thin film lines by photolithography of thick resist and subsequent galvanic selective growth of metals.

It is known tht with the present technique thin film lines with a high thickness (5-7 micron) are attainable with minimum width of 40-50 micron, and a tolerance in the width of 5-8 micron.

The present trend in the field of microwave brings to the necessity to utilize thin film lines at higher and higher frequencies (20-30 GHz), with high characteristic impedance (200-300 ohm) and with lumped element circuits. It is, therefore, necessary to utilize thin lines, with a width of about 4-10 micron with high thickness (5-7 micron) and high definition, that is with nearly vertical walls and with tolerances in the width of about 1 micron.

It is also known that high definition lines can be obtained with the technique of the vacuum sputtering of gold, but the speed of growth of such technique is very low, therefore, not useable for mass production. Furthermore, a tremendous waste of gold occurs because of the need to add gold first on all the parts of the insulating support for then to obtain the lines. With this method one has the further disadvantage of the undercutting of the lines for a width at least equal to their thickness, therefore, the walls of the same lines result hollow.

It is further known that utilizing the technique of selective galvanic growth one obtains a good speed of growth and the gold can only be added on the conductive paths to be carried out. But with such technique at present it is not possible to obtain the required definition and tolerance of the lines. In fact, the seats in which gold has to be grown are obtained in a thick substrate of photoresist. To acquire the wanted mechanical resistance of the walls of such seats a thermic treatment is needed. Said thermic treatment deforms the walls of the seats by making them round and the lines attained by growing the gold assumes a very irregular mushroom shape.

It is an object of the present invention to overcome the above mentioned drawbacks and to indicate a process to obtain thin film lines by photolithography of thick resist and subsequent selective galvanic growth of metal, which enables to obtain thin lines with high definition, that is with nearly vertical walls and with a maximum tolerance in the width of about 1 micron.

In order to obtain the above said object the present invention refers to a process to obtain thin film lines by photolithography of thick resist and subsequent galvanic selective growth of metals, characterized in that such thick resist is obtained by a deposit of a first polyimide layer on an insulating support followed by a first cycle of cure and a successive deposit of a second polyimide layer followed by a second cycle of cure.

Further objects and advantages of the present invention will be clear from the following detailed description of a preferred form of realization and from the enclosed drawings, given only as explicating not limiting examples, where figures from 1 to 11 represent the subsequent steps of a cycle to obtain thin film lines by photolithography of thick resist according to the present invention.

With reference to the drawings the cycle to obtain the lines is carried out according to the following steps:

FIG. 1: metallization by cathode sputtering in vacuum of an insulating support 1, i.e. of alumina, or glass, or sapphire or of beryllium oxide, with a triple layer 2 formed by a resistive layer of tantalum nitride, by an adhesive layer of titanium and by an antidiffusive layer of palladium with the whole thickness of 4000-4500 Angstrom.

Figure 2:
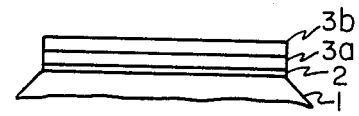

FIG. 2: centrifugal deposition of a first polyimide layer 3a with the thickness of 2-5 micron and cure of it according to a first cycle of cure in an air furnace for about 2 hrs. in a range of 120°-150° C. and for successively 2 hrs. in a range of 170°-220° C., followed by the centrifugal deposition of a second polyimide layer 3b with a thickness of 2-5 micron and cure of it according to a second cycle of cure in an air furnace for about 2 hrs. in a range of 150°-170° C. and for successive 2 hrs. in a range of 170°-220° C. The two polyimide layers 3a and 3b result perfectly amalgamated and form a uniform polyimide layer 3 with the total thickness of 4-10 micron.

Figure 3:
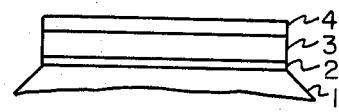

FIG. 3: deposition by cathode sputtering in vacuum of a titanium oxide layer 4 with the thickness of 1000 Angstrom on the polyimide layer 3.

Figure 4:
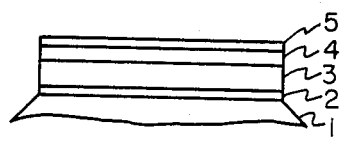

FIG. 4: centrifugal deposition of a photosensitive lacquer layer 5 with the thickness of 0.8 micron on the titanium oxide layer 4.

Figure 5:
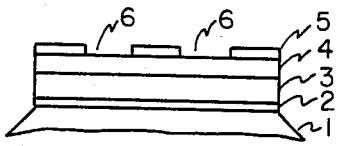

FIG. 5: ultraviolet light exposure, through a metal mask, of the photosensitive lacquer 5 and development of the photosensitive lacquer layer 5 by which some seats 6 with the width of 10 micron are formed. The width of such seats 6 of course depends from the width of the requested lines. With the process object of the present invention lines with a width of about 2 micron have been obtained.

Figure 6:
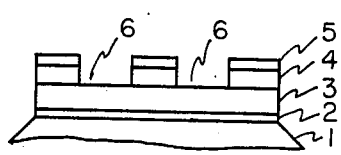

FIG. 6: etching of the titanium oxide metallic layer 4 with a hydrofluoric acid by which the seats 6 are also obtained in the titanium oxide metallic layer 4.

Figure 7:
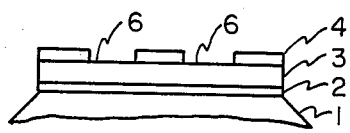

FIG. 7: removal of the photosensitive lacquer layer 5 by bathing it in a solution recommended by the manufacturer of the photosensitive lacquer 5.

Figure 8:
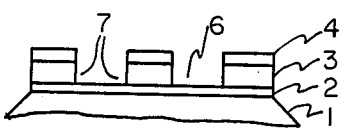

FIG. 8: dry etching in oxygen gas plasma with a high pressure (4-8 mbar) and with a low density of excitation power (2-7 W/cm$^2$) at a radio frequency of 13,56 Mhz of the polyimide layer 3, for a period of 5-10 minutes, by which some seats 6 with nearly vertical walls 7 are also obtained in the polyimide layer 3.

Figure 9:
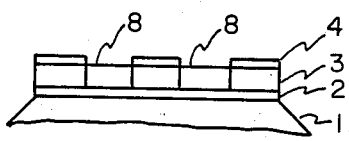

FIG. 9: selective galvanic deposition of a metal, for example gold or silver or copper, in the seats 6, obtained in the polyimide layer 3, by which some conductor lines 8 with a thickness of 3-7 micron and walls 9 nearly vertical are obtained inside the seats 6.

Figure 10:
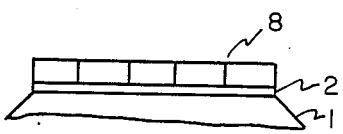

FIG. 10: removal of the titanium oxide metallic layer 4 with a hydrofluoric acid solution.

Figure 11:
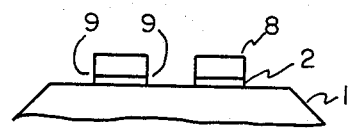

FIG. 11: dry etching in oxygen gas plasma with a high pressure (4-8 mbar) and with a low density of excitation power (2-7 W/cm$^2$) at a radio frequency of 13.56 Mhz for a period of 5-10 minutes, by which the polyimide layer 3 is completely removed. Without breaking the vacuum, sucking the oxygen gas plasma, immission of argon gas at a low pressure (2-4×10$^{-4}$ mbar) and at a high density of excitation power (9-15

W/cm$^2$) and continuation of the dry etching for a period of 5-10 minutes, by which the triple metalization layer 2 is completely removed too.

The described cycle consents to obtain lines 8 of a width of 2-10 micron, of a thickness of 3-7 micron with walls 9 nearly vertical and a tolerance in the width of ±0.5 micron. Such result has been achieved by means of the use of polyimide as material for the realization of the seats 6, by means of the cycles of cure of polyimide and by means of the appropriate dry etching parameter chosen to obtain the same seats 6. In fact the use of polyimide and the particular initial cycles of cure assure an excellent mechanical resistance to the polyimide layer 3, while the kind of etching and the parameters chosen to obtain the seats 6 assure an excellent definition to the walls 7 of the same seats 6.

Advantages of the described process to obtain thin film lines object of the present invention are clear. In particular they result from the fact that with the said process it is possible to achieve lines with a width of 2-10 micron, with a thickness of 3-7 micron and with a tolerance in the width of ±0.5 micron, obtaining an improvement respect to the known technique of a factor 20 in the reduction of the width of the lines and of a factor 10 in the reduction of the tolerance in the width of the same lines, from the fact that such lines approximate very well the theoretical design valves, from the fact that it is possible to obtain lines which are very close to each other, from the fact that only the strictly indispensable quantity of metal, in particular gold, is utilized with a remarkable economic saving and from the fact that the working time is reduced with further reduction in manufacturing costs.

It is clear that many modifications are possible, for the man skilled in the art, to the process to obtain thin film lines object of the present invention without getting away from the scope of the present invention.

We claim:

1. A process to obtain thin film lines on an insulating support by photolithography of thick resist and subsequent galvanic growth of metals, characterized in that:
   said insulating support covered by a metalization layer;
   said thick resist is obtained by a deposit of a first polyimide layer on said metalization layer followed by a first cycle of cure and a successive deposit of a second polyimide layer followed by a second cycle of cure, said first and second polyimide cured layers forming an homogeneous and uniform polyimide layer;
   said polyimide layer covered by a metallic layer;
   said metallic layer covered by a photosensitive lacquer layer;
   said photosensitive lacquer layer exposed to ultraviolet light through a metallic mask;
   said exposed photosensitive lacquer layer is developed to produce seats in said photosensitive lacquer layer;
   said metallic layer is etched to produce seats in said metallic layer;
   said polyimide layer etched by oxygen gas plasma for a first predetermined time interval;
   said etching producing in said polyimide layer seats with essentially vertical walls;
   a selective galvanic deposition of metal lines within said seats characterized by essentially vertical walls; and
   said metallic layer is removed and said polyimide layer is etched by oxygen gas plasma for a second predetermined time interval.

2. Process to obtain thin film lines according to claim 1, characterized in that said etching by oxygen gas plasma comes at a high temperature and at low density of excitation power.

3. Process to obtain thin film lines according to claim 2, characterized in that the pressure of said oxygen gas plasma is comprised between 4 and 8 mbar and in that the density of excitation power is comprised between 2 and 7 W/cm$^2$.

4. Process to obtain thin film lines according to claim 1, characterized in that said second predetermined time interval is comprised between 5 and 10 minutes.

5. A process to obtain thin film lines on an insulating support by photolithography of thick resist and subsequent galvanic growth of metals, characterized in that:
   said insulating support covered by a metalization layer;
   said thick resist is obtained by a deposit of a first polyimide layer on said metalization layer followed by a first cycle of cure and a successive deposit of a second polyimide layer followed by a second cycle of cure, said first and second polyimide cured layers forming an homogeneous and uniform polyimide layer;
   said polyimide layer covered by a metallic layer;
   said metallic layer covered by a photosensitive lacquer layer;
   said photosensitive lacquer layer exposed to ultraviolet light through a metallic mask;
   said exposed photosensitive layer is developed to produce seats in said photosensitive lacquer layer;
   said metallic layer is etched to produce seats in said metallic layer;
   said polyimide layer etched by oxygen gas plasma for a first predetermined time interval;
   said etching producing in said polyimide layer seats with essentially vertical walls;
   a selective galvanic deposition of metal lines within said seats characterized by essentially vertical walls;
   said metallic layer is removed;
   said polyimide is etched by oxygen gas plasma for a second predetermined time interval; and
   after the said second predetermined time interval, the said etching is continued for a third predetermined time interval substituting the said oxygen gas plasma with argon gas.

6. Process to obtain thin film lines according to claim 5, characterized in that said replacement of said oxygen gas plasma with the said argon gas is effected without breaking the vacuum.

7. Process to obtain thin film lines according to claim 5, characterized in that said etching by argon gas in said third predetermined time interval comes at low pressure and at high density of excitation power.

8. Process to obtain thin film lines according to claim 7, characterized in that the pressure of said argon gas is comprised between $2 \times 10^{-4}$ and $4 \times 10^{-4}$ mbar and in that the density of excitation power of said argon gas is compried between 9 and 15 W/cm$^2$.

9. Process to obtain thin film lines according to claim 5, characterized in that said third predetermined time interval is comprised between 5 and 10 minutes.

* * * * *